United States Patent
Chen et al.

(10) Patent No.: US 6,365,062 B1
(45) Date of Patent: Apr. 2, 2002

(54) TREATMENT ON SILICON OXYNITRIDE

(75) Inventors: I. T. Chen, Taipie; Horng-Bor Lu, Hsinchu, both of (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/307,219

(22) Filed: May 7, 1999

(51) Int. Cl.[7] .................... B44C 1/22; H01L 21/302

(52) U.S. Cl. ........................... 216/67; 438/725

(58) Field of Search .................. 216/67; 438/725, 438/963; 134/1.1, 1.3, 26

(56) References Cited

U.S. PATENT DOCUMENTS

| | | | | |
|---|---|---|---|---|
| 4,529,860 A | * | 7/1985 | Robb ........................ | 219/121 |
| 5,904,154 A | * | 5/1999 | Chien et al. ................ | 134/1.2 |
| 5,970,376 A | * | 10/1999 | Chen ......................... | 438/637 |
| 6,105,588 A | * | 8/2000 | Li et al. ..................... | 134/1.1 |

* cited by examiner

Primary Examiner—Randy Gulakowski
Assistant Examiner—Shamim Ahmed
(74) Attorney, Agent, or Firm—Martine & Penilla, LLP

(57) ABSTRACT

A method to treat a silicon oxynitride surface, including a silicon oxynitride surface covered by a photo resist layer, is described in which the photo resist layer is first removed by an oxygen plasma treatment process, followed by an argon plasma treatment process to overetch the SiON layer.

4 Claims, 2 Drawing Sheets

TREATMENT ON SILICON OXYNITRIDE

BACKGROUND OF THE INVENTION

1. Field of the Invention

This invention relates to a treatment on a silicon oxynitride, and more particularly, relates to a treatment of removing the silicon oxynitride.

2. Description of the Related Art

Silicon oxynitride (SiON) is often used on a polysilicon gate as an anti-reflection layer. A silicon oxynitride layer is a silicon rich film comprising many dangling bonds on the surface. Such a surface tends to form a layer of silicon dioxide ($SiO_2$) when the surface is exposed to oxygen free radicals (O-*). For example, as a photo resist layer on a surface of a silicon oxynitride layer is removed by means of oxygen plasma, $SiO_2$ is formed on the surface of the SiON layer. As a result, it is difficult to remove the silicon oxynitride layer, which lies underneath the silicon dioxide, by phosphoric acid in a latter segment of the process.

FIG. 1 depicts a molecular structure of a surface of a SiON layer, which comprises many dangling bonds 102. These dangling bonds 102 react easily with the oxygen free radicals in the surrounding to form a layer of $SiO_2$ on the surface of the SiON layer. The $SiO_2$ layer 202 covering the SiON layer 200 is illustrated in FIG. 2.

Although the phosphoric acid is very effective in removing the silicon oxynitride, it is rather ineffective in removing the silicon dioxide. Hence, it is difficult to remove the silicon oxynitride layer 200 located underneath the silicon dioxide layer 202 using the phosphoric acid, and is often resulted with silicon oxynitride residues.

A photo resist layer on a SiON layer is conventionally removed by an etching with oxygen plasma to the endpoint. An overetch is further conducted to completely remove the photo resist layer. A disadvantage with this approach is the oxygen plasma provides a source of oxygen and easily leads to a formation of a $SiO_2$ layer on the surface of the SiON layer.

SUMMARY OF THE INVENTION

Accordingly, this invention provides a treatment on a silicon oxynitride surface, which is also applicable to a removal of a silicon oxynitride layer covered by a photo resist layer. Oxygen plasma is used to remove a majority of the photo resist layer, followed by an overetch using non-oxygen plasma to remove a residual of the photo resist layer.

Inert gas plasma is preferred for the non-oxygen plasma; and argon plasma is preferred among the inert gas plasma. The duration of the overetch is preferably in the vicinity of about 20% to about 25% of the duration of the oxygen plasma etching process.

The current invention also provides a method to remove a silicon oxide material, wherein the silicon oxide material is resulted from a reaction between silicon containing materials and oxygen plasma. By means of an ion bombardment method, the inert gas plasma is used to treat the silicon oxide material, and the inert gas plasma is preferred to be argon plasma.

The current invention also provides a method to remove a photo resist layer. The method is applicable in a removal of a photo resist layer covering a layer of silicon oxynitride. Oxygen plasma is used to remove a majority of the photo resist layer, followed by an overetch using non-oxygen plasma to remove a residual of the photo resist layer.

Inert gas plasma is preferred for the non-oxygen plasma; and the inert gas plasma is preferred to be argon plasma. The duration for the overtech is preferably in a vicinity of about 20% to about 25% of the duration of the oxygen plasma etching process.

The foregoing general descriptions are exemplary only, other additional advantages of the current invention are further disclosed in the following embodiment.

BRIEF DESCRIPTION OF THE DRAWINGS

The accompanying drawings illustrate presently the preferred embodiments of the invention and together with the general description given above and the detailed description of the preferred embodiment given below, serve to explain the principles of the invention.

DESCRIPTION OF THE PREFERRED EMBODIMENTS

Figure 1:
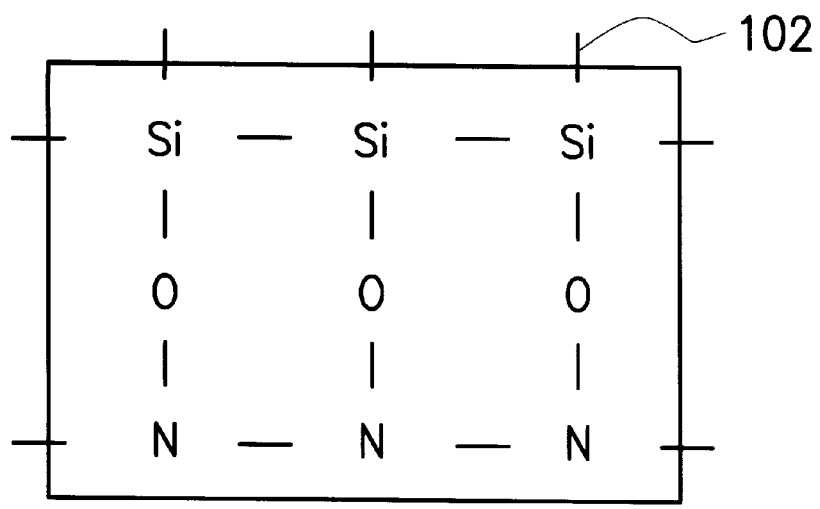
FIG. 1 is a diagram illustrating the molecular structure of a surface of a SiON layer.
Figure 2:
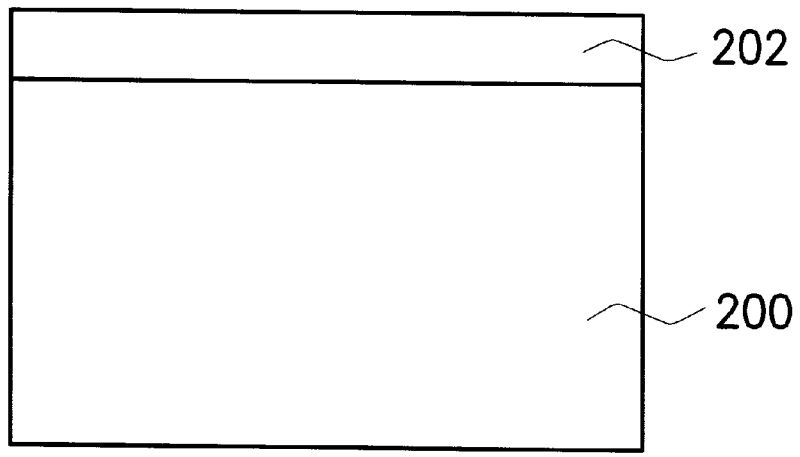
FIG. 2 is a schematic diagram showing a silicon oxynitride layer covered by a silicon dioxide ($SiO_2$) layer.
Figure 3A:
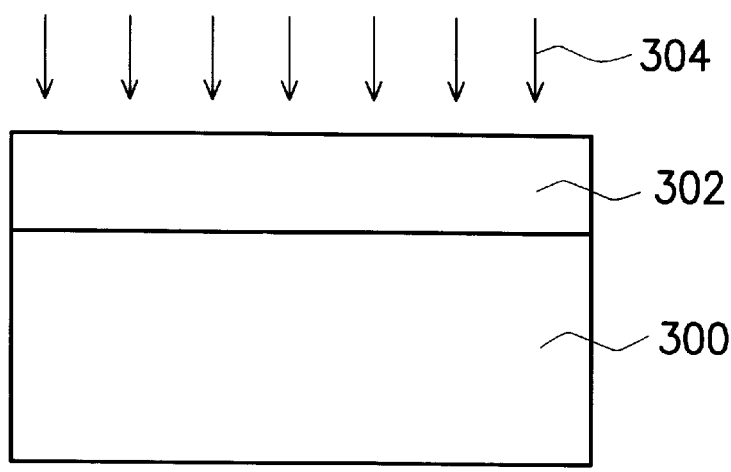
FIGS. 3A to 3B are schematic diagrams showing the progression of a method for treating a silicon oxynitride surface.

As shown in FIG. 3A, a photo resist layer 302 covers a silicon oxynitride (SiON) layer 300. The SiON layer 300 can be an anti-reflection layer on a polysilicon gate. Since the anti-reflection layer is removed in a latter segment of a semiconductor manufacturing process, the susceptibility of the anti-reflection layer to a phosphoric acid removal is very important.

Still referring to FIG. 3A, the arrows 304 in the figure indicate an oxygen plasma treatment process is being conducted as a first etching step of the photo resist layer 302. The endpoint of the etching process is normally defined at a point above the SiON layer. Although it is possible to control the endpoint for the etching process, a silicon oxide material, such as silicon dioxide, may be formed on the silicon oxynitride layer 300 during the oxygen plasma treatment process. Since it is difficult to control the endpoint of the etching process, even with a majority of the photo resist layer 302 being removed, a second etching step is required to remove a residual portion of the photo resist layer 302.

Figure 3B:
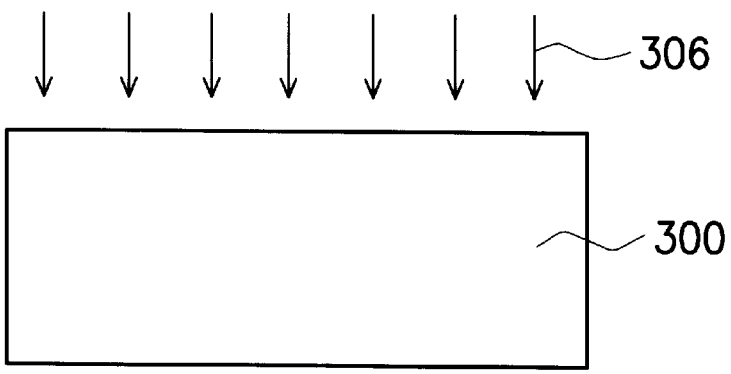

Referring to FIG. 3B, arrows 306 in the figure indicate a non-oxygen plasma treatment process is being conducted, wherein the non-oxygen plasma includes inert gas plasma, and preferably argon plasma. This treatment, which is regarded as a second etching step for the photo resist layer, is an overetch to completely remove the photo resist layer 302 (as in FIG. 3A). The duration of the overetch is approximately 20% to 25% of that of the first etching step. Furthermore, the non-oxygen plasma treatment process does not lead to a formation of a silicon oxide material, such as silicon dioxide, on the SiON layer. Besides being used to overetch, the non-oxygen plasma treatment process possesses other advantages. For example, by means of an ion bombardment method, the silicon oxide material produced from an oxygen plasma treatment process is removed. As a result of riding the silicon oxide material, the SiON layer 300 is easily removed by the phosphoric acid in a latter segment of the semiconductor manufacturing process.

Figure 4:
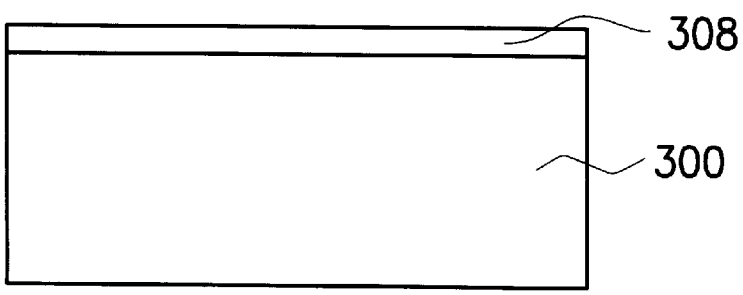
FIGS. 4 is a schematic diagram showing the formation of a $SiO_2$ layer resulted from an oxygen plasma overetching process.

It is important to note that if oxygen plasma is used for the overetch, the effect of this invention is not accomplished because a silicon dioxide layer 308 is formed on the SiON layer, as indicated in FIG. 4. This $SiO_2$ layer 308 is difficult to remove; therefore it is also problematic in removing the underlying SiON layer 300.

According to the current invention, using non-oxygen plasma, for example argon plasma, to overetch, the plasma not only does not promote the formation of $SiO_2$, but also can remove the existing $SiO_2$ by means of an ion bombardment.

Additional advantages and modifications will readily occur to those skilled in the art from consideration of the specification and the practice of the invention disclosed herein. It is intended that the specification and examples be considered as exemplary only, with a true scope and spirit of the invention being indicated by the following claims.

What is claimed is:

1. A method for removing a photoresist layer covering a silicon oxynitride layer, the method comprising:

using an oxygen plasma to remove a majority of a photoresist layer covering a silicon oxynitride layer; and after using the oxygen plasma, using an inert gas plasma to remove a residual portion of the photoresist layer, wherein substantially no silicon oxide-based material is generated during the oxygen plasma operation and the inert gas plasma operation.

2. The method of claim 1, wherein a duration required for removing the residual portion of the photoresist layer is approximately 20% to approximately 25% of a duration required for removing the majority of the photoresist layer.

3. A method for removing a photoresist layer covering a silicon oxynitride layer, the method comprising:

using an oxygen plasma to remove a majority of a photoresist layer covering a silicon oxynitride layer; and after using the oxygen plasma, using an argon plasma to remove a residual portion of the photoresist layer, wherein substantially no silicon oxide-based material is generated during the oxygen plasma operation and the argon plasma operation.

4. The method of claim 3, wherein a duration required for removing the residual portion of the photoresist layer is approximately 20% to approximately 25% of a duration required for removing the majority of the photoresist layer.

* * * * *